(12) United States Patent
Ding et al.

(10) Patent No.: US 9,431,495 B2
(45) Date of Patent: Aug. 30, 2016

(54) METHOD OF FORMING SGT MOSFETS WITH IMPROVED TERMINATION BREAKDOWN VOLTAGE

(71) Applicant: Alpha and Omega Semiconductor Incorporated, Sunnyvale, CA (US)

(72) Inventors: Yongping Ding, San Jose, CA (US); Yeeheng Lee, San Jose, CA (US); Xiaobin Wang, San Jose, CA (US); Madhur Bobde, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/455,150

(22) Filed: Aug. 8, 2014

(65) Prior Publication Data
US 2016/0043192 A1 Feb. 11, 2016

(51) Int. Cl.
| | |
|---|---|
| *H01L 21/28* | (2006.01) |
| *H01L 21/76* | (2006.01) |
| *H01L 29/423* | (2006.01) |
| *H01L 29/78* | (2006.01) |
| *H01L 29/66* | (2006.01) |

(52) U.S. Cl.
CPC ..... *H01L 29/4236* (2013.01); *H01L 29/66666* (2013.01); *H01L 29/7827* (2013.01)

(58) Field of Classification Search
CPC ....... H01L 21/02; H01L 21/20; H01L 21/76; H01L 21/76229; H01L 21/76224; H01L 21/763; H01L 21/31053; H01L 21/31116; H01L 21/32139; H01L 21/31144; H01L 21/31138; H01L 29/66181; H01L 27/1087; H01L 27/10861; H01L 21/762; H01L 21/331; H01L 21/3105; H01L 21/306; H01L 21/302; H01L 21/461; H01L 21/28; H01L 21/28008
USPC ....... 438/259, 270, 589, 427, 386, 388, 689, 438/734, 735, 736, 749, 424, 426, 425, 429, 438/443, 700, 738, 271, 587, 588
See application file for complete search history.

(56) References Cited

U.S. PATENT DOCUMENTS

| | | | |
|---|---|---|---|
| 2005/0181577 A1* | 8/2005 | Hshieh | H01L 29/0634 438/427 |
| 2012/0153503 A1* | 6/2012 | Ponoth | H01L 21/76816 257/774 |

* cited by examiner

*Primary Examiner* — Chuong A Luu

(57) ABSTRACT

A method of manufacturing a trench power MOSFET device with improved UIS performance and a high avalanche breakdown voltage is disclosed. The method includes performing a first etching of the epitaxial layer to form an active trench with an initial depth in an active area of the semiconductor substrate and a termination trench with a desired depth in a termination area of the semiconductor substrate, wherein the initial depth of the active trench is smaller than the desired depth of the termination trench and performing a second etching to increase the depth of the active trench to a desired depth wherein a depth difference between the desired depth of the active trench and the desired depth of the termination trench is smaller than a depth difference between the initial depth of the active trench and the desired depth of the termination trench.

5 Claims, 6 Drawing Sheets

US 9,431,495 B2

METHOD OF FORMING SGT MOSFETS WITH IMPROVED TERMINATION BREAKDOWN VOLTAGE

FIELD OF PRESENT INVENTION

The present invention relates to a power MOSFET semiconductor device, specifically, the present invention aims to provide a trench gate semiconductor device with better unclamped inductive switching (UIS) performance and improved termination avalanche breakdown voltage (BV) and a method of preparing thereof.

BACKGROUND OF THE INVENTION

In power semiconductor devices, a gate may be formed in a trench that extends downward from the surface of the silicon substrate, for example, a trench MOSFET, a trench insulated gate bipolar transistor (IGBT) and the likes, which include trench gates with different functions. However, due to this structural characteristic, the electrical field intensity at the bottom of the trench reaches maximum level of the device. As the voltage climbs to the avalanche breakdown point, impact ionization, which happens during avalanche breakdown, occurs at the corner of the trench, resulting in avalanche breakdown current. In general avalanche breakdown easily lead to hot carrier effect. When the breakdown occurs close to the gate oxide layer, the hot carrier can be captured and injected into the gate oxide layers, which can damage or rupture the gate oxide layer, leading to long-term reliability problems of the power device. In addition, such trench often limits the device to achieve the high breakdown voltage.

In general, if the avalanche breakdown occurs during the low current levels, the performance of the device may not be significantly hindered when the breakdown occurs at termination region, and there is no concern about safe operating area (SOA) of the device. However if during some special operating period, such as during the unclamped inductive switching (UIS) period, since the inductive current does not change suddenly, the device often bears some relatively large voltage intensity, which is equivalent to the device being in a state of high current avalanche breakdown, the termination region with very limited surface area may not be able to handle the power loss safely and effectively, because the active area of the power device cannot be reduced to increase the termination area, the breakdown in the termination area will become a negative effect on the SOA of the device. Particularly when the trench depth in the active area and the trench depth in the termination area are not equal due to the fact that trenches in the termination area are usually made wider to provide termination functions and/or to facilitate electrical connections to the electrodes within the trenches, and that wider trenches are etched deeper in the same trench etching process, the termination area will breakdown at a low voltage level resulting in initial breakdown of device occurs in the termination area.

In view of the prior art's problems, it is necessary to keep the device in the SOA and at an optimal UIS conditions to optimize the distribution of the electric field intensity of the power semiconductor device by providing a device with substantial the same trench depth in both the active area and termination area.

It is within this context that embodiments of the present invention arise.

BRIEF DESCRIPTION OF THE DRAWINGS

Objects and advantages of the invention will become apparent upon reading the following detailed description and upon reference to the accompanying drawings. However, the accompanying drawings are for illustration and explanation only and do not limit to the scope of the invention.

DESCRIPTION OF THE SPECIFIC EMBODIMENTS

Figure 1A:
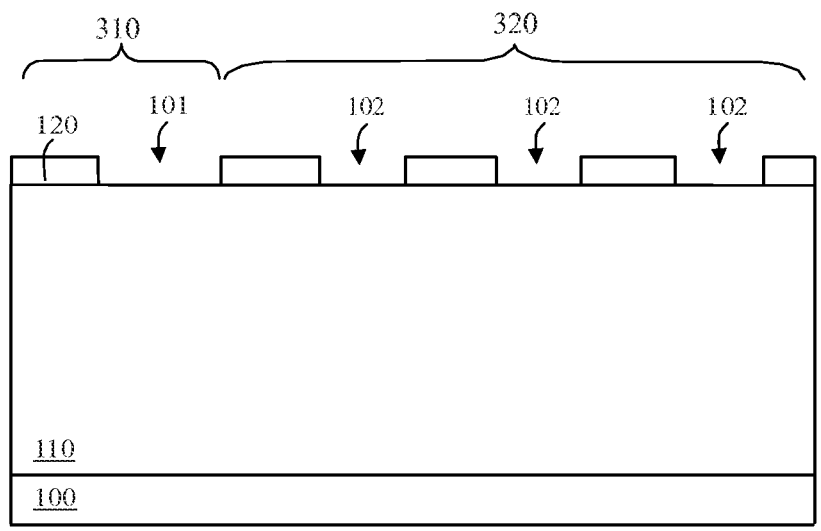
FIGS. 1A-1O are cross-sectional diagrams illustrating a method for preparing a trench type MOSFET device.
Figure 1B:
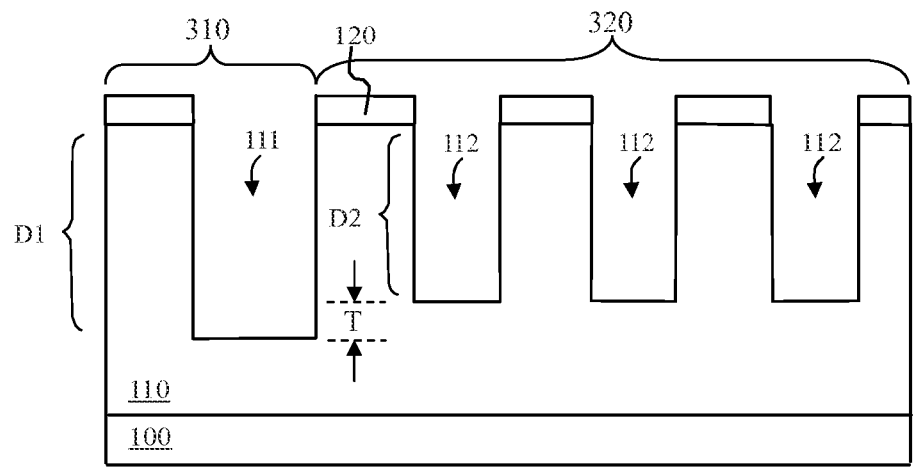

In FIG. 1A, a semiconductor substrate includes of a heavily doped bottom substrate 100 of a first conductivity type and an epitaxial layer 110 with the same conductivity type of the bottom substrate 100 but a lower doping concentration formed atop the bottom substrate 100. In a preferred embodiment, the N− type epitaxial layer 110 which is grown on top of the N type substrate 100. In FIG. 1A, a hard mask layer 120 with openings 101 and 102 is applied atop the semiconductor substrate as the etching mask for an anisotropic dry etching process to the epitaxial layer 110 to form the trenches in the active area 320 and termination area 310. In FIG. 1B termination trenches 111 and active trenches 112 are formed by etching the epitaxial layer 110 though the openings 101 and 102 respectively from the surface of the epitaxial layer 110, extending downward and ended within the epitaxial layer 110. In FIG. 1A, which is a cross-sectional view illustrating a portion of a semiconductor substrate, the termination trench 111 is formed in the termination area 310 of the semiconductor substrate and the active trenches 112 are formed in the active region 320 of the semiconductor substrate, where the active region 320 is surrounded by the termination region 310. Although numerous termination trenches can be arranged in the termination region 310, for convenience of description, only one termination trench 111 is shown in the figures. The hard mask layer 120 may be a single layer structure such as a thick SiO2 layer, but it is preferred a multilayer structure, e.g. comprising Silica-silicon nitride-silicon dioxide deposited sequentially from the bottom to top on the top surface of the semiconductor substrate. Usually, the openings 101 and 102 can be made by coating a photoresist with a desired pattern on the hard mask 120 (not shown), and then exposing and developing the photoresist followed by etching the hard mask layer 120. The opening 101 is larger than the opening 102 for etching a wider trench in the termination area of the semiconductor substrate.

In FIG. 1B, with the hard mask layer 120 as an etching mask, the first etching step to form the trench is performed. It is well known in the art that, in the etching process, the wider the opening on the hard mask layer 120 is, the wider the trench will be, thus the reactive particles of the reactant gas of dry etching can enter more easily into the wider trench; on the contrary, the smaller the opening on the hard mask layer 120 is, the more narrow the trench is defined, thus the reactive particles of the reactant gas of dry etching is more difficult to enter into the narrower trench. This will result in etch rate discrepancies in trenches with different width in plasma etching. Since the opening 101 is wider than the opening 102, the termination trench 111 is wider than the active trench 112. Furthermore, the etching rate of the semiconductor substrate through the wider opening 101 to form the termination trench 111 is faster than the etching rate of the semiconductor substrate through the narrower opening 102 to form the active trench 112, resulting in the trench 111 is deeper than the trench 112

As shown in FIG. 1B, the anisotropic dry etching of the epitaxial layer 110 (e.g., RIE method) forms termination trench 111 with a desired depth D1 and the active trench 112 having an initial depth D2, which is not the final desired depth. It is well known in the art, a depth difference T between the initial depth D2 of the active trench and the desired depth of the termination trench D1 is sufficient to make the breakdown voltage of the MOSFET device being clamped at low breakdown voltage point at termination area, which is described in detail in subsequent content.

Figure 1C:
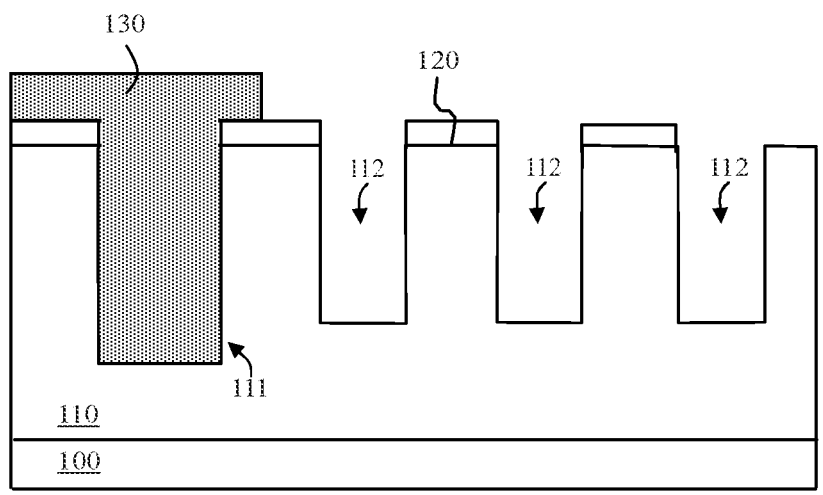

In FIG. 1C, an additional mask 130, such as a photoresist, is being applied atop the termination area 310 and the active are 320 of the entire semiconductor substrate covering the top of the hard mask layer 120 and filling the termination trench 111 and active trench 112. After exposure and development through lithography technique, a portion of the mask 130 atop the active region 320 is selectively removed, thus the remaining of the mask 130 only covers the termination trench 111 in the termination area 310. As such, the active trench 112 in the active area 320 is exposed, but the termination trench 111 in the termination area is covered by mask 130.

Figure 1D:
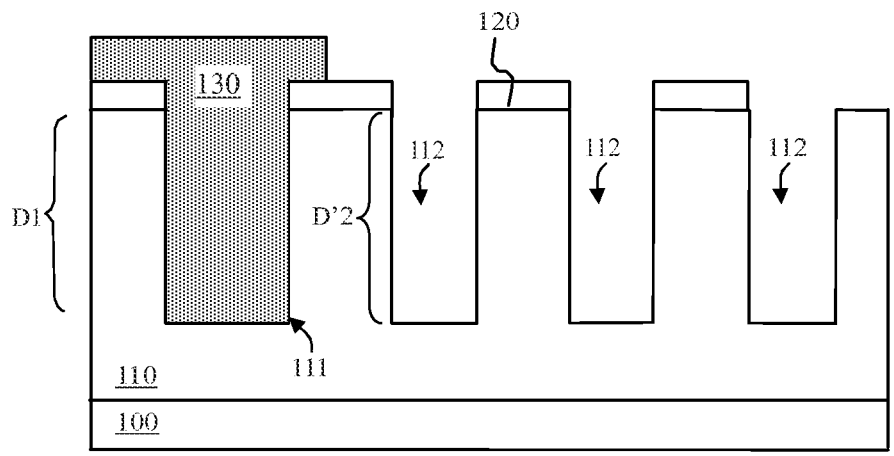
Figure 1E:
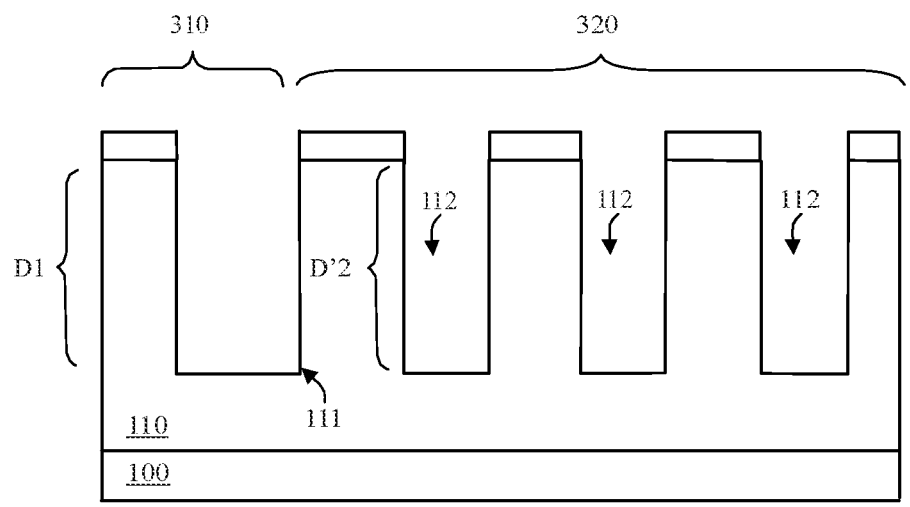

In FIG. 1D, the second etching step is performed, for example an anisotropic dry etching. In this step, the hard mask 120 is still used as the etching mask to etch the active trench 112 deeper in the active area 320, while the termination area 310 is blocked from the etching by the mask 130. The etching stops when the active trench 112 reaches a desired depth of D'2. The goal of the present invention is to reduce the depth difference between the desired depth D1 of the termination trench 111 and the desired depth D'2 of the active trenches 112, so that the depth D'2 of the active trenches 112 is almost equal to the depth D1 of the termination trench 111. As shown in FIG. 1E, the mask 130 is then removed, thus termination trenches 111 and the active trench 112 extending downward to and ending in the epitaxial layer 110 with their bottom at about the same level with each other are formed.

FIGS. 1A-1D of the preferred embodiment of the present invention show the steps of making the active trench and the termination trench with a minimum difference in depth, and the subsequent preparation steps to complete the trench MOSFET device can be any conventional method. By way of example, and not by way of limitation, FIGS. 1E-1M illustrate the subsequent steps to complete the MOSFET device with improved breakdown voltage.

Figure 1F:
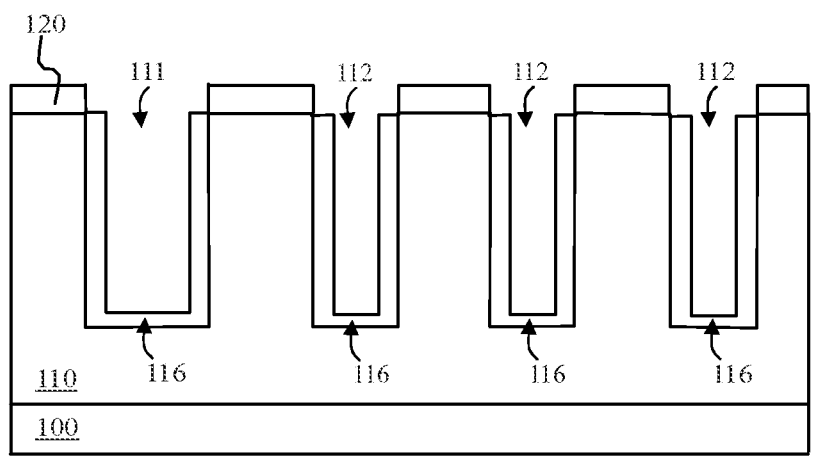
Figure 1G:
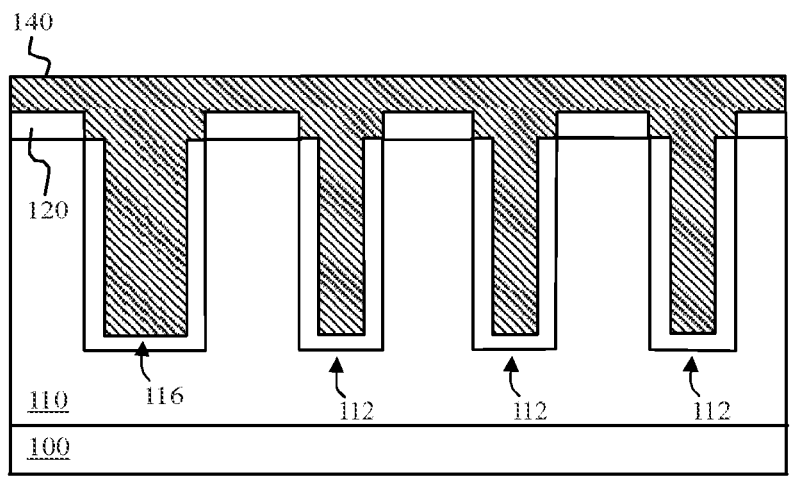

In FIG. 1E, after mask 130 is removed, the sidewall and the bottom of the termination trench 111 and the active trench 112 are exposed. Then, as shown in FIG. 1F, the bottom and the sidewall of each termination trench 111 and active trench 112 are grown with a thick insulating layer 116, such as silicon dioxide layer, for example using thermal oxidation process. As shown in FIG. 1G, conductive material 140 (e.g. doped polysilicon) is deposited to fill the termination trench 111 and the active trench 112 and atop the hard mask layer 120. The conductive material 140 can be in situ phosphorus doped polysilicon formed by chemical vapor deposition CVD.

Figure 1H:
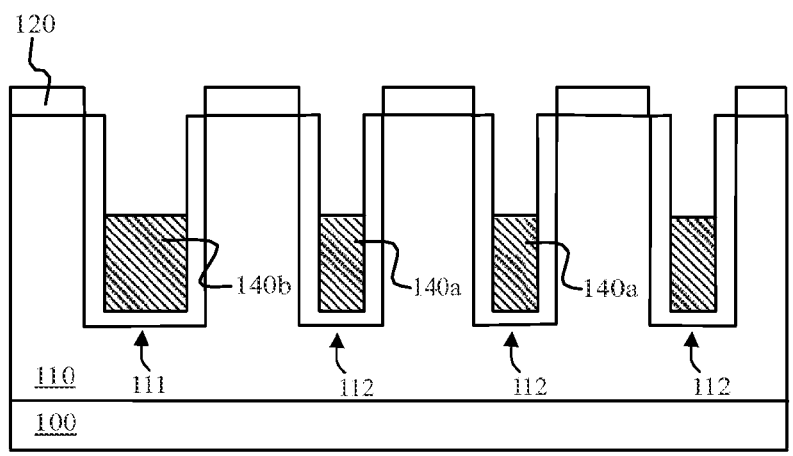

As shown in FIG. 1H, the conductive material 140 is etched back to remove the conductive material 140 atop the hard mask layer 120 and at the top portion inside each of the termination trench 111 and the active trench 112 leaving an interstitial space in the top portion of the trench. As shown in this figure, the conductive material 140b is retained in the lower portion of the termination trench 111, and the conductive material 140a is retained in the lower portion of the active trenches 112. This can usually be achieved by standard polysilicon dry etch back process.

Figure 1I:
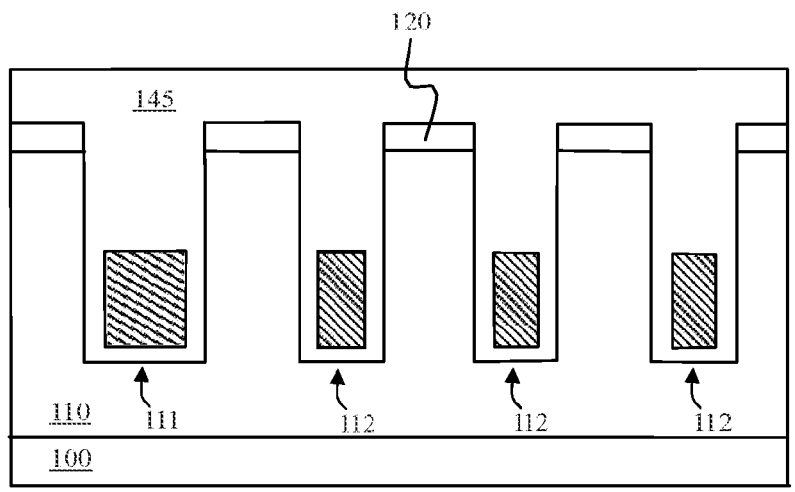
Figure 1J:
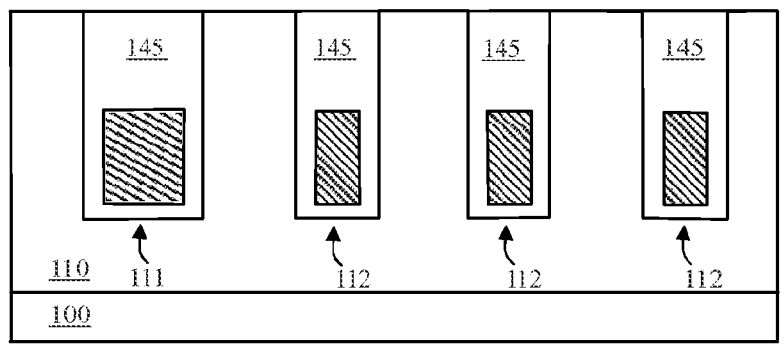
Figure 1K:
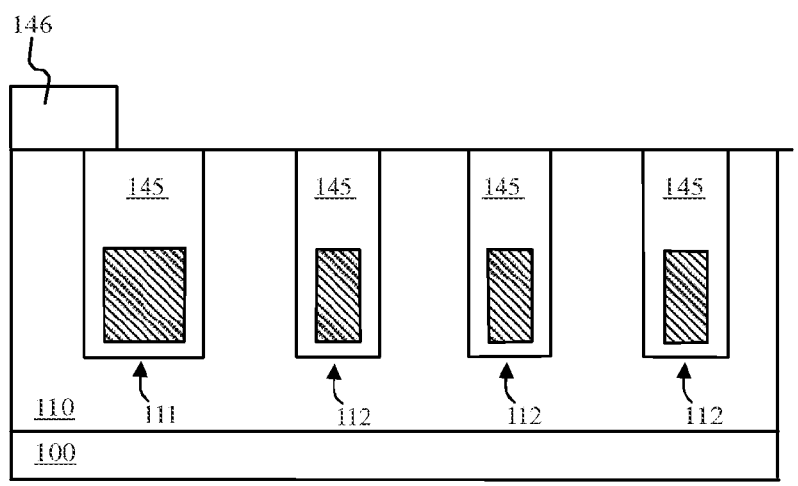
Figure 1L:
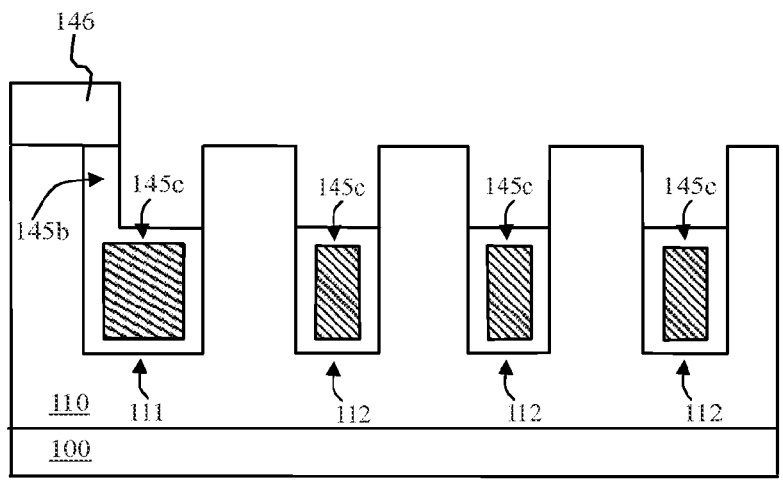

In FIG. 1I, the insulating material 145 (typically silicon oxide) is deposited to fill into the interstitial space at the top portion of termination trenches 111 and active trenches 112 and atop the hard mask 120 by low pressure chemical vapor deposition LPCVD or plasma enhanced chemical vapor deposition PECVD. As shown in FIG. 1J, the hard mask layer 120 and insulating material 145 atop the semiconductor substrate are removed (for example using CMP method), thus only the insulating material 145 in the upper portion of termination trench 111 and active trench 112 is retained, which is merged with the top portion of the insulating layer 146 deposited on the sidewall of the trenches. As shown in FIG. 1K, a mask 146 is applied atop the termination area of the semiconductor substrate where a portion of termination trench 111 close to farther from the active area is covered by the mask 146, but the portion of termination trench 111 close to the active region 320 is exposed from the mask 146. As sown in FIG. 1L, the insulating material 145 exposed from the mask 146 in the top portion of termination trench 111 and top portion of active trench 112 is etched back. The remained insulating material 145c forms the insulting layer on top of conductive materials 140b and 140a located at the bottom of the termination trench 111 and the active trench 112 respectively. As a result, an interstitial space is formed in the upper portion of the termination trench 111 and the active trench 112 as such the upper portion of the sidewalls of trenches 112 and the upper portion of the sidewall of the termination trench 111 close to the active region 320 and the top surface of the semiconductor substrate are exposed. Since insulating layer 145b is retained in the upper portion of the sidewall of the termination trench 111 farther from the active area hence this sidewall is not exposed after that mask 146 is removed.

Figure 1M:
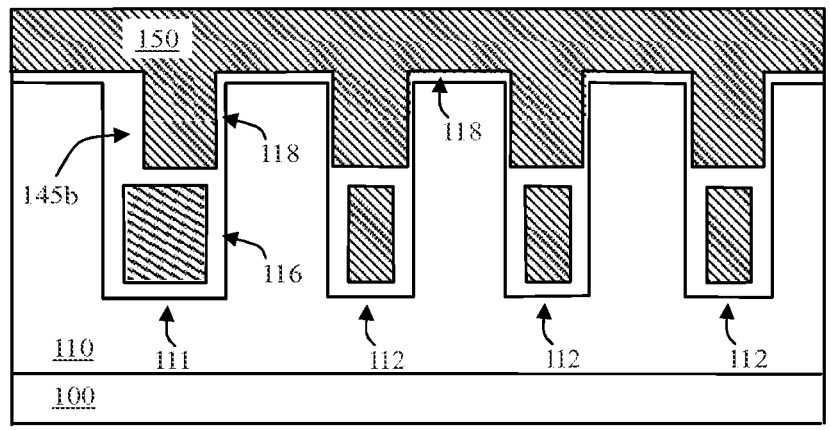
Figure 1N:
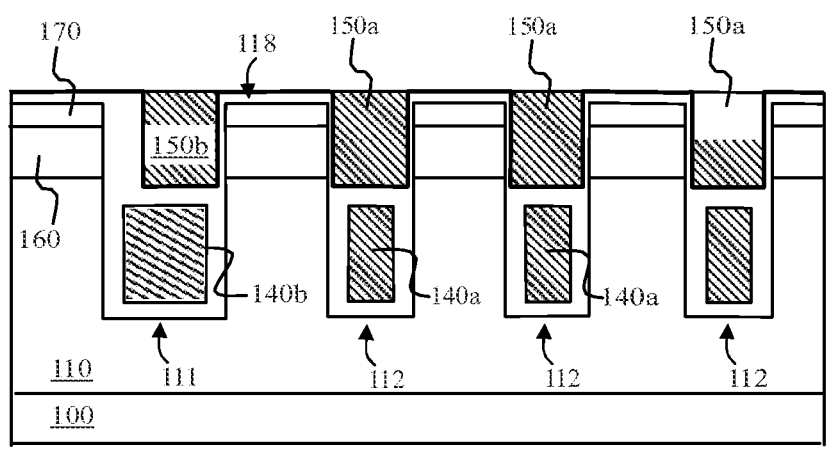

In FIG. 1M, a thin insulating layer 118 is formed on the exposed top surface of the semiconductor substrate, i.e. the upper surface of the epitaxial layer 110, on the exposed sidewalls in the top portion of the termination trench 111 and the active trench 112, where the insulating layer 118 lining the upper portion of the sidewalls of the trenches 112 and 111 is much thinner than the insulating layer 116 lining the lower portion of the sidewalls and the bottom of the trenches. Thereafter, another conductive material 150 (e.g., in-situ phosphorus-doped polysilicon) is deposited atop the insulating layer 118 that covers the top surface of the semiconductor substrate, and inside the interstitial space of the termination trench 111 and the active trenches 112. The conductive material 150 is then etched back to remove the conductive material 150 on the top surface of the semiconductor substrate resulting the conductive material 150a formed in the upper portion of active trenches 112 and conductive material 150b formed in the upper portion of the termination trench 111. In FIG. 1N, the insulating layer 145b, which is much thicker than the insulating layer 118, causes the conductive material 150b in the trenches 111 to be offset to the active region 320, and the top surface of the semiconductor substrate is covered with the insulating layer 118.

As shown in FIG. 1N, the body layer 160 and the source layer 170 are formed at the top portion of the epitaxial layer 110 through a blanket implantation. Conductive type of the body layer 160 is opposite to that of the semiconductor substrate (i.e., P type), while the source layer 170 has the same conductivity type as the semiconductor substrate, which is the N type, but the doping concentration of the source layer 170 is higher than that of the epitaxial layer 110. The body layer 160 is formed at the top portion of the epitaxial layer 110 and surrounds the top portion of the sidewalls of trenches 111 and 112, and the source layer 170 is formed at the top portion of and shallower than the body layer 160 (in the vicinity of the surface of the epitaxial layer 110) and also surrounds the top portion of the sidewalls of trenches 111 and 112. It is well known in the art that, the bottom of the body layer 160 must be slightly higher than the bottom of the conducting material 150a and 150b to form a vertical channel inversion layer along the sidewalls of active trench 112 or termination trench 111.

Figure 1O:
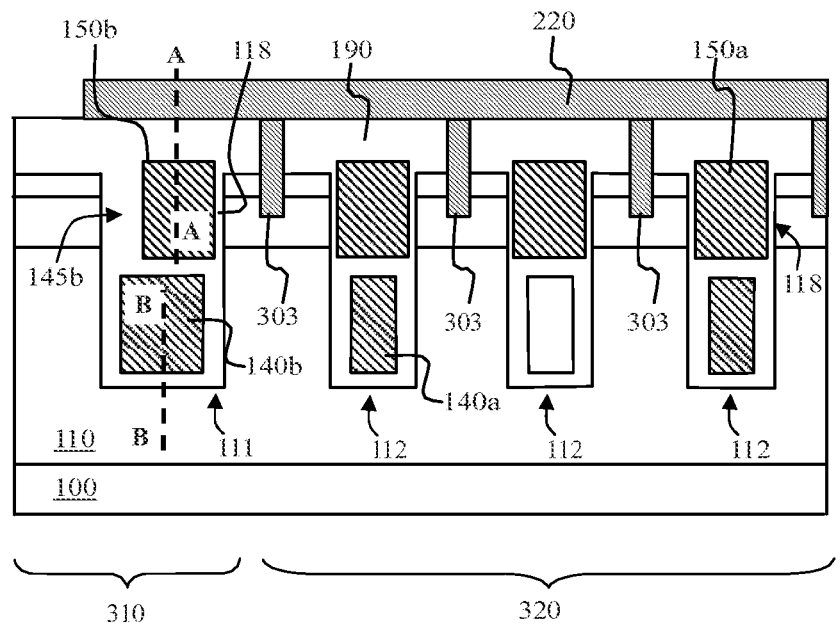

In FIG. 1O, an insulating passivation layer 190 (for e.g. a low temperature oxide LTO and/or Borophosphosilicate glass BPSG) is deposited covering the top surface of the semiconductor substrate merging with the insulating layer 118 on the top surface of the semiconductor substrate and covering the top of insulating material 145b and the conductive material 150b and 150a. Then, another layer of photoresist is spin coated on top of the insulating passivation layer 190 (not shown) and the contact hole 303 are formed via an anisotropic dry etching. As shown in FIG. 1O, the contact hole 303 extends downward through the insulating passivation layer 190 and the source layer 170 and ends in the body layer 160 in the activation area 320. In an embodiment, some contact holes 303 extends downward into the body layer 160 in the mesa between two adjacent active trenches 112, and some contact holes 303 extend downward into the body layer in the mesa between the termination trench 111 and the outermost active trench 112. Optionally, a heavily doped body contact region (P+ type) are then formed around the bottom of the contact holes 303 in the body layer 160 for better Ohmic contact (not shown).

In FIG. 1O, a metal barrier layer (not shown) is deposited lining at the bottom and on the sidewalls of the contact holes 303 as well as on top of the insulating passivation layer 190 followed by the deposition of a metal (such as tungsten) to fill the contact holes 303 forming the metal plugs or metal connectors.

Then, a top metal layer is deposited covering the top surface of the insulating passivation layer 190 and the metal barrier layer followed by the patterning the top metal layer and the metal barrier layer to form at least one top metal electrode 220.

The top metal electrode 220 (as a source electrode) at least overlaps the active region 320 and electrically contacts with the metal plug formed in the contact hole 303 shorted the body layer 160 and the source layer 170. The conductive material 140a at the bottom of active trench 112 is connected to the conductive material 140b at the bottom of termination trench 111 in a third dimension (not shown), as such the conductive material 140a and 140b are also electrically connected to the top metal electrode 220 and thus are at the source potential. Furthermore, the conductive material 150a in the top portion of active trench 112 and the conductive material 150b in the top portion of the termination trench 111 are electrically connected to each other in the third dimension (not shown) and are also electrically connected to the conductive material inside the gate pick up trench (not shown), and thus are electrically connected to a metal gate electrode on top of the insulating passivation layer 190 (not shown). In addition, metal electrodes on the bottom surface of the bottom substrate 100 functions as the drain electrode.

MOSFETs are formed in the active region 320, where the conductive material 140a at the bottom portion of trench 112 functions as the shield gate of the transistor, the conductive material 150a in the top portion functions as the control gate of the transistor with the control gate electrode 150a overlapping and electrically isolating from the bottom shield gate 140a with the insulating layer 145c. The insulating layer 118 at the top portion of the active trenches 112 and the termination trench 111-1 functioning as a gate oxide layer is thinner than the insulating layer 116 at the lower portion of the active trench 112 or termination trench 111.

In a preferred embodiment, a portion of the insulating layer 145 on the upper portion of termination trench 111 is etched away, then the conductive material 150b subsequently filled the etched space also functions as a gate electrode, and thus vertical channel inversion layer is generated in the body layer 160 along the upper portion of the sidewall of the termination trench 111 close to the active region 320 and the insulating layer 118 at the sidewall of the trench 111 functions as the gate oxide layer. Furthermore, the insulating layer 145b on the upper portion of the sidewall of termination trench 111 farther from the active area is thicker than the insulating layer 116 and 118. The gate electrode 150b and the shield electrode 140b below are electrically insulated from each other by the insulating layer 145c in-between.

Figure 2:
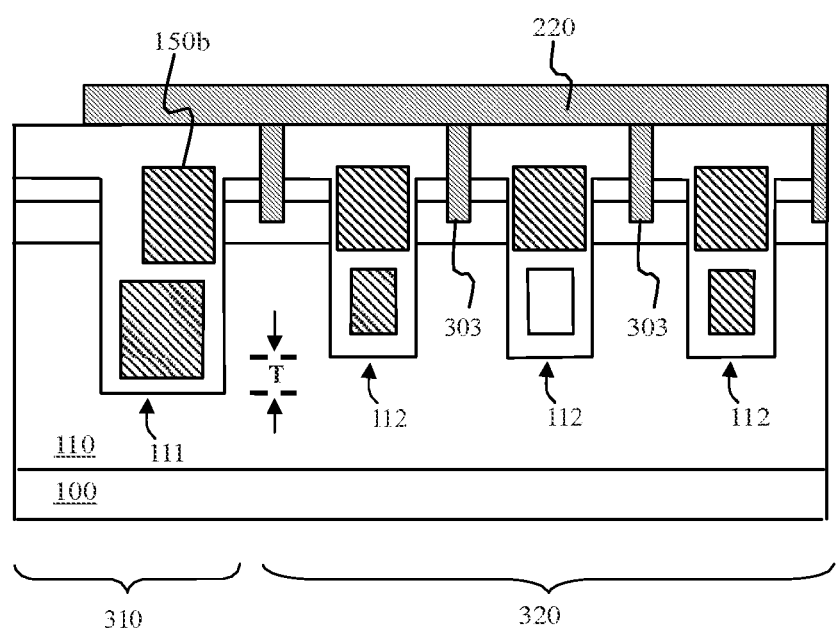
FIG. 2 is a cross-sectional diagram illustrating the trench depth difference between the active trench and the termination trench.

FIG. 2 is a cross-section diagram illustrating a portion of a conventional SGT MOSFET that is basically similar to FIG. 1O excepting the depth of the active trench 112 and of the termination trench 111 are not the same (similar as shown FIG. 1B). In FIG. 2, when voltage breakdown is carried out between the source and the drain of trench MOSFET device, the value of the depth difference T between the depth of the active trench 112 and the depth of the termination trench 111 reflects the voltage tolerance capabilities of the device: the larger the T value, the smaller the tolerance capacity for breakdown voltage, or vice versa, the smaller the T value, the greater the breakdown voltage capability of the device.

When T value is larger, the device is clamped at a lower breakdown voltage in the termination region. For example, when a MOSFET device operates during unclamped inductive switching (UIS) event, the weak point for avalanche breakdown is at the bottom corner of the termination trench 111, especially the bottom corner close to the active region 320, and impact ionization occurs during the breakdown process resulting in an avalanche current. Avalanche breakdown generally results in hot carrier effect. When the breakdown occurs close to the insulating layer 116 (e.g. oxide layer), the hot carrier can be captured into the insulating layer 116, which can damage or break the gate oxide layer inducing long-term reliability problems of the power devices. In the present invention, T value is reduced, thus electric field strength and density at the bottom corner of termination trench 111 in the termination region but closest to the active region has been reduced, so that the chances of avalanche breakdown at the weak point in termination region 310 is effectively inhibited improving the breakdown voltage at the termination region and robustness of the device, resulting in a MOSFET device with higher breakdown voltage (BVDSS) when the gate and drain source are shorted.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A method for preparing a trench power semiconductor device comprising:
   providing a semiconductor substrate comprising a bottom substrate and an epitaxial layer formed atop the bottom substrate;

performing a first etching of the epitaxial layer to form an active trench with an initial depth in an active area of the semiconductor substrate and a termination trench with a desired depth in a termination area of the semiconductor substrate, wherein the initial depth of the active trench is less than the desired depth of the termination trench;

applying a mask to cover the termination trench but exposing the active trench;

performing a second etching to increase the depth of the active trench to a desired depth of the active trench, wherein a depth difference between the desired depth of the active trench and the desired depth of the termination trench is smaller less than a depth difference between the initial depth of the active trench and the desired depth of the termination trench;

forming an insulating layer lining bottom and sidewalls of the active trench and the termination trench;

filling a conductive material into the active trench and the termination trench;

etching back the conductive material in an upper portion of the active trench and the termination trench leaving only the conductive material in the lower portion of the active trench and the termination trench;

filling the upper portion of the active trench and the termination trench with an insulating material;

etching back a top portion of the insulating material in the active trench and a portion of the insulting material on sidewall of the termination trench near the active area forming an insulating layer on top of the conductive material in the lower portion of the active trench and the termination trench and a remaining portion of the insulating layer at the sidewall of the termination trench farther from the active area; and forming another insulating layer lining on exposed sidewall on the upper portion of the active trench and the termination trench and then filling the upper portion of the active trench and the termination trench with a conductive material.

2. The method of claim 1, wherein the step of performing a first etching of the epitaxial layer comprises:

applying a first hard mask layer over the semiconductor substrates;

forming openings therein, wherein an opening for the active trench is smaller than an opening for the termination trench; and performing the first etching of the epitaxial layer through the opening for the active trench and opening for the termination trench to form the termination trench and the active trench, wherein the termination trench is wider than the active trench, and wherein an etch rate of forming the termination trench is faster than an etch rate of forming the active trench, the desired depth of termination trench is greater than the initial depth of the active trench.

3. The method of claim 1 further comprising:

implanting a top portion of the epitaxial layer with dopants of a conductivity type opposite to that of the semiconductor substrate to form a body layer surrounding the upper portion of the active trench and the termination trench; and implanting dopants of a same conductivity type as the semiconductor substrate into a top portion of the body layer in the active area to form a source layer surrounding the upper portion of the active trench.

4. The method of claim 1, wherein after the step of filling the upper portion of each active trench and the termination trench with an insulating material and before the step of etching back a top portion of the insulating material in the active trench and a portion of the insulting material at the sidewall of the termination trench close to the active area further comprises:

applying a mask to cover a portion of the insulting material at the sidewall of the termination trench farther from the active area, whereas the portion of the insulting material at the sidewall of the termination trench close to the active area is exposed from the mask, wherein the conductive material filled in the upper portion of the termination trench is offset to the active area.

5. The method of claim 1, wherein the depth difference between the desired depth of the active trench and the desired depth of the termination trench is minimized, which suppresses the avalanche breakdown induced at the bottom corner of the termination trench close to the active area.

* * * * *